United States Patent
Hinojosa et al.

(10) Patent No.: US 7,116,569 B2
(45) Date of Patent: Oct. 3, 2006

(54) METHOD AND APPARATUS FOR SELECTING OPERATING CHARACTERISTICS OF A CONTENT ADDRESSABLE MEMORY BY USING A COMPARE MASK

(75) Inventors: Joaquin Hinojosa, Round Rock, TX (US); Eric Jason Fluhr, Round Rock, TX (US); Michael Ju Hyeok Lee, Austin, TX (US); Jose Angel Paredes, Austin, TX (US); Ed Seewann, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 35 days.

(21) Appl. No.: 11/055,803

(22) Filed: Feb. 11, 2005

(65) Prior Publication Data

US 2006/0181909 A1 Aug. 17, 2006

(51) Int. Cl.
*G11C 15/00* (2006.01)
(52) U.S. Cl. .................... 365/49; 365/189.07; 365/190
(58) Field of Classification Search ................ 365/49, 365/189.07, 190
See application file for complete search history.

(56) References Cited

U.S. PATENT DOCUMENTS

| 4,618,968 | A | 10/1986 | Sibigtroth |
| 4,723,224 | A | 2/1988 | Van Hulett et al. |
| 5,383,146 | A | 1/1995 | Threewitt |
| 6,289,414 | B1 | 9/2001 | Feldmeier et al. |
| 6,646,900 | B1 * | 11/2003 | Tsuda et al. ................ 365/49 |
| 6,738,862 | B1 | 5/2004 | Ross et al. |
| 6,744,688 | B1 | 6/2004 | Gillingham et al. |
| 6,839,256 | B1 | 1/2005 | Proebsting et al. |
| 2002/0032681 | A1 | 3/2002 | Feldmeier et al. |
| 2004/0100809 | A1 * | 5/2004 | Andersen et al. ............ 365/49 |

OTHER PUBLICATIONS

Arsovski et al., "A Ternary Content-Addressable Memory . . . ", IEEE Journal of Solid State Circuits, vol. 38, No. 1, (Jan. 2003).
Berkeley, "EE141 Lecture 19-Sequential Logic" (Fall 2004).
Crunch, "Exploring the Basics of AC Scan". Inovys (c) Jul. 2004.
Defossez, "XAPP202 Xilinx—CAM in ATM Applications" (Jan. 2001).
Helwig, et al., "High Speed CAM", IBM Deutschland Entwicklung GMbH (1996).
Krishnamurthy, "Address Translation—Lecture Notes" (Spring 2004).

(Continued)

*Primary Examiner*—Anh Phung
*Assistant Examiner*—Dang Nguyen
(74) *Attorney, Agent, or Firm*—Mark E. McBurney; Mark P. Kahler

(57) ABSTRACT

A CAM system is disclosed in which requests for address translation are provided as input search data to a dynamic compare bitline generator. The dynamic compare bitline generator also receives a compare mask and applies the compare mask to associated input search data bits on a per bit basis. The mask contains information that specifies a selected page size and a selected logic mode that can be applied to a compare array in which the specified search is conducted. The compare array is coupled to a data array to which the compare array indicates a result of the search.

20 Claims, 3 Drawing Sheets

OTHER PUBLICATIONS

Krishnamurthy, "Address Translation (cont'd)—Lecture Notes" (Spring 2004).

Music Semiconductors, Application Note AN-N19, "Using The MU9C1965A LANCAM MP For Data Wider Than 128 Bits" (Sep. 1998).

Music Semiconductors, Prelim. Data Sheet—MU9C1965A/L LANCAM MP (Jul. 2002).

Music Semiconductors, Application Brief AB-N6—What is a CAM? (Sep. 1998).

Pagiamtzis, "Content—Addressable Memory Introduction" (c) 1993.

Pagiarrtzis, "Low Power CAM Using Pipelined Hierarchical Search Scheme, IEEE Journal of Solid State Circuits", (Sep. 2004).

Pagiamtzis, Pipelined Match-Lines and Hierarchical Search-Lines for Low Power CAMs, IEEE (Sep. 2003).

Stojanovic, et al., "Comp Analysis of MS Latches", IEEE Journal of Solid State Circuit, vol. 34, No. 4 (Apr. 1999).

* cited by examiner

FIG. 2

EXAMPLES OF COMPARE MASK USE IN EXTENDED TO REAL ADDRESS TRANSLATION (ERAT) CAM FOR PAGE SIZES AND MODE SUPPORT

| LOOKUP TYPE | PROGRAM ADDRESS | | | | | | ENTRY VALID | PAGE SIZES | | | LOGIC MODES | | | |
|---|---|---|---|---|---|---|---|---|---|---|---|---|---|---|
| | 00:23 | 24:29 | 30:35 | 36:39 | 40:47 | 48:51 | 52 | 4 KB 53 | 64 KB 54 | 16 MB 55 | TI 56 | DR 57 | TA 58 | HV 59 |
| 1  4 KB MATCH PAGE INDEPENDENT | | | | | | | | x | | | | | | |
| 2  64 KB MATCH PAGE INDEPENDENT | | | | | x | | | x | x | | | | | |
| 3  16 MB MATCH PAGE INDEPENDENT | | | | | x | x | | x | x | x | | | | |
| 4  4 KB ONLY PAGES THREAD SPECIFIC | | | | | | | | x | | | | | | |
| 5  64 KB ONLY PAGES THREAD SPECIFIC | | | | x | | x | | | x | | | | | |
| 6  16 MB ONLY PAGES THREAD SPECIFIC | | | | x | | x | | | | x | | | | |
| 7  4 KB ONLY PAGES THREAD INDEPENDENT | | | | | | | | x | | | x | | | |
| 8  64 KB ONLY PAGES THREAD INDEPENDENT | | | | | | | | | x | | x | | | |
| 9  16 MB ONLY PAGES THREAD INDEPENDENT | | | | | x | x | | x | x | x | x | | | |
| 10  REAL MODE ENTRIES | x | x | x | x | x | x | x | x | x | x | x | | | |
| 11  TRANSLATION ALGORITHM ENTRIES | x | x | x | x | x | | x | x | x | x | x | | | |
| 12  HYPERVISOR ENTRIES | x | x | x | x | x | | x | x | x | x | x | | | |
| 13  REAL MODE HYPERVISOR ENTRIES | x | x | x | x | | x | x | x | x | x | x | | | |
| 14  TLBIE LOCAL 4 KB PAGE | x | x | x | | | | | x | | | | x | x | x |
| 15  TLBIE LOCAL 64 KB PAGE | x | x | x | | | | | | x | | | x | x | x |
| 16  TLBIE REMOTE 4 KB PAGE | x | x | x | | | | | x | | | x | x | x | x |
| 17  TLBIE REMOTE 64 KB PAGE | x | x | x | | | | | | x | | x | x | x | x |
| 18  SLBIE | | | | x | x | | x | x | x | x | | x | x | x |
| 19  SLBIA | x | | | x | x | | x | x | x | x | | x | x | x |

METHOD AND APPARATUS FOR SELECTING OPERATING CHARACTERISTICS OF A CONTENT ADDRESSABLE MEMORY BY USING A COMPARE MASK

CROSS REFERENCE TO RELATED PATENT APPLICATIONS

This patent application is related to the U.S. Patent Application entitled "Method and Apparatus For Controlling The Timing Of Precharge In A Content Addressable Memory System", inventors Yuen H. Chan, Masood Ahmed Khan, Michael Ju Hyeok Lee and Ed Seewann, application Ser. No. 11/055,802, filed Feb. 11, 2005, and assigned to the same assignee, the disclosure of which is incorporated herein by reference in its entirety.

This patent application is related to the U.S. Patent Application entitled "Content Addressable Memory Including a Dual Mode Cycle Boundary Latch", inventors Masood Ahmed Khan, Michael Ju Hyeok Lee and Ed Seewann, application Ser. No. 11/055,830, filed Feb. 11, 2005, and assigned to the same assignee, the disclosure of which is incorporated herein by reference in its entirety.

TECHNICAL FIELD OF THE INVENTION

The disclosures herein relate generally to content addressable memories, and more particularly to selecting the operating characteristics of content addressable memories (CAMs).

BACKGROUND

A content addressable memory or CAM may be viewed conceptually as a search engine that is fabricated from hardware rather than software. Software search engines, which are algorithmically based, tend to be substantially slower than hardware-based CAMs. CAMs can be formed from arrays of conventional semiconductor memory, for example, static random access memory (SRAM), together with additional comparison circuitry that enables a search operation to finish in a single system clock cycle. One routine search-intensive task that benefits significantly from CAM is the address lookup task performed in routers such as Internet routers. Other typical uses of CAM include caches such as processor caches, translation look aside buffers (TLBs), segment lookaside buffers (SLBs) used in the industry for processor memory management, effective to real address translators (ERATs), database accelerators, and data compression applications.

A conventional CAM is configured as an array of individual CAM core cells. A typical binary CAM core cell supports the storage and searching of binary bits, namely zero or one (0, 1). A single CAM cell stores a binary bit in what is referred to as a "true and complement" data form, meaning a zero will be stored in both a zero state and a complemented one state within the core cell. In contrast, a one will be stored both as a one state and a complemented zero state. Horizontal and vertical rows of NOR-based architecture CAM core cells can be configured to form a large CAM array. In such an array, the CAM size is described first by the number of horizontal cells which is also called the word size. And second, the CAM size is described by the vertical cell count which corresponds to the number of words stored and available during a compare operation. In a compare operation, input data is simultaneously compared against each word stored in the CAM.

CAM core cells include both storage and comparison circuitry. Search lines runs vertically through the CAM cell and broadcast the search data to all CAM cells at the same time. Match lines run horizontally across the array and indicate whether or not the search data matches a particular row's word. In more detail, an activated match line (an active high logic state) indicates a match and a deactivated match line (a low logic state) indicates a mismatch for a particular word corresponding to that match line. These match lines which describe the output of the CAM array are typically coupled to memory devices such as SRAMs or dynamic random access memories (DRAMs) to provide the actual output match data.

A CAM search operation begins with precharging all match lines high, thus placing all match lines temporarily in the match state. Next, the search lines broadcast the search data in binary vertically simultaneously across all words of the array. Next, each CAM core cell compares its stored single binary data against the bit on its corresponding search lines. Cells with matching data do not affect the corresponding word's match line, but cells with a mismatch pull down the corresponding word's match line. The aggregate result is that the match line of any word having at least one bit mismatch is pulled low. All other match lines remain activated (precharged high). Usually almost all match lines are driven low thus indicating mismatches for the words corresponding to those match lines. Typically, one or a small number of match lines will remain high to indicate a matching word or words. Finally, the match lines that remain high, indicating a match, are used as the input to an address lookup memory that is coupled to the CAM. The data thus addressed in the address lookup memory is then read from the address lookup memory as output data to provide the ultimate result of the search.

CAM structures typically match a given input data pattern against all bits of all words or entries to determine a match. However, in some circumstances, it is desirable to match on different subsets of bits per word, instead of all bits of the word. In this situation a compare mask can be used to provide compares on subsets of bits per word or to provide bitwise compares. By masking against each individual bit of the input data, any specific bit or collection of bits of the word data may be compared or masked out and ignored as desired.

What is needed is a method and apparatus for selecting the operating characteristics of a CAM.

SUMMARY

Accordingly, in one embodiment, a method is disclosed for operating a content addressable memory (CAM). The method includes providing a CAM that supports a plurality of selectable features. The method also includes applying mask data to input search data to form masked input search data, the mask data indicating at least one of the selectable features selected. The method further includes supplying the masked input search data to a compare array in the CAM to specify a search in the compare array and to specify the at least one selectable feature to be applied during the search. The method also includes providing a result of the search to an output.

In another embodiment, a content addressable memory (CAM) system is disclosed. The CAM system includes a compare array that supports a plurality of selectable features. The CAM system also includes a dynamic compare bitline generator, coupled to the compare array, that combines mask data with input search data to form masked input search data. The mask data indicates at least one of the selectable features as being selected. The masked input search data is supplied to the compare array to specify a search in the compare array and to specify the at least one selectable feature to be applied during the search. The CAM system also includes a data array, coupled to the compare array, that provides the result of the search in the compare array.

BRIEF DESCRIPTION OF THE DRAWINGS

The appended drawings illustrate only exemplary embodiments of the invention and therefore do not limit its scope because the inventive concepts lend themselves to other equally effective embodiments.

FIG. 2 is a table showing the compare mask per bit compare used on the ERAT effective to real address translation CAM example of FIG. 1.

DETAILED DESCRIPTION

In systems that employ CAM architecture, it is common to compare all bits of the input data at once, i.e. simultaneously in parallel. However, it is also possible to mask out a certain bit or bits of the input data during the CAM compare using software algorithms that consume several clock cycles to achieve the masking and comparison. Moreover, it is also possible to mask the data at the input of the CAM array and provide bitwise data comparison in a single CAM clock cycle. Additionally, a single CAM clock cycle compare can provide address translation for one lookup cycle, whereas a sequence of translations can be combined to provide address translations for a thread or instruction stream. A thread is considered to be a series of translation results linked to a common program or instruction stream in a software program. Moreover, multiple programs or threads can be active at a given time, in which case, a thread Identification (ID) bit is required to indicate which instruction stream is using the CAM system for translation currently. Threads or program instruction streams are considered to be a subset of an operating system process. A series of programs define a process within an operating system in which, one or more operating systems may be active at one time, and multiple programs within each operating system may be active at one time. During a CAM system cycle however, only one address translation is active. In one embodiment, the disclosed CAM structure permits selection of address page sizes and/or logic modes via control bits in a compare mask as explained in more detail below.

Figure 1:
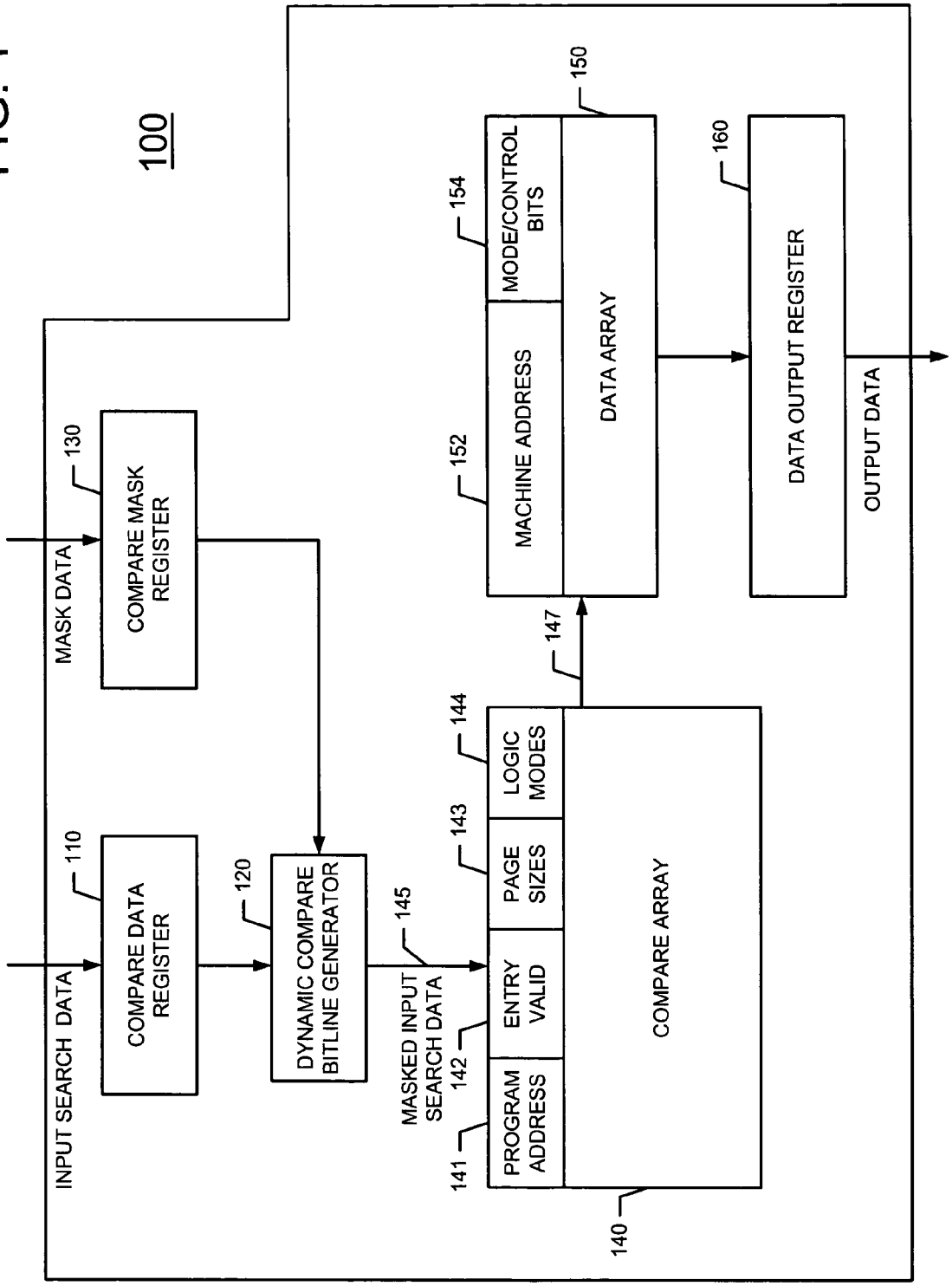
FIG. 1 is a block diagram of one embodiment of the disclosed CAM system.

FIG. 1 is a block diagram of one embodiment of the disclosed CAM system 100. CAM system 100 includes a compare data register 110 to which input search data is supplied in a standard word size, for example 60 bits. The input search data is data for which CAM system 100 will conduct a search to see if the word pattern of such data matches any word entry in CAM system 100. CAM system 100 is readily adaptable to accommodate other input data words sizes as well. By way of example, the input search data provided to compare data register 110 may be an address for which address translation is desired. Compare data register 110 stores the input search data for which searching is desired in CAM system 100. Compare data register 110 is coupled to the dynamic compare bitline generator 120, the operation of which will be explained in more detail below.

CAM system 100 also includes a compare mask register 130 to which mask data is provided as input. The mask data exhibits the same word size as the word size of the input search data provided to compare data register 110, namely 60 bits in this particular example. Compare mask register 130 stores the mask data provide thereto. As seen in FIG. 1, the output of compare mask register 130 is coupled to one input of dynamic compare bitline generator 120 and the compare data register 110 is coupled to another input of dynamic compare bitline generator 120.

Dynamic compare bitline generator 120 receives input search data from compare data register 110 and mask data from compare mask register 130. Generator 120 applies the mask data to the input search data to produce masked input search data that is provided to compare array 140 for searching. Generator 120 thus acts as a combiner which applies the mask data to the input search data to form the masked input search data that is supplied to compare array 140 by search lines 145 In more detail, dynamic compare bitline generator 120 performs a bit by bit compare between the input search data and the mask data and, on a per bit basis, provides a masked input search data word at its output. In other words, dynamic compare bitline generator 120 performs an equivalent bit to bit binary AND operation between input search data and mask data.

An example of the action of dynamic compare bitline generator 120 now follows. Assume that one eight bit input search data segment in binary with one's and zero's is 1111 0000. An example of a mask data input may be represented as 1010 1010. An AND function would result in masking any bit of input search data bit where they align with a 0 in the mask, such that each bit of the mask that is represented by a 0 will result in a 0 output from dynamic compare bitline generator 120 for that resultant bit regardless of the data presented by compare data register 110. This action is described as masking or blocking input search data bits. Additionally any mask bit that is a 1 will allow pass through or not mask the input search data, such that the input search data 1 or 0 will pass through dynamic compare bitline generator 120 unchanged. In this example the resultant masked input search data will be 1010 0000 or effectively a binary anding of the two sets of data from compare data register 110 and compare mask register 130.

Dynamic compare bitline generator 120 is coupled to compare array 140 so that the masked input search data is supplied via search lines 145 to compare array 140. In actual practice search lines 145 include true and complement lines. True complement compare data is often referred to as differential data and is supplied directly via search lines 145 to each of the CAM cells within compare array 140.

Compare array 140 as shown in FIG. 1 is a CAM array wherein the word or entry is segmented in this embodiment into four distinct address bit segments, namely program address 141, Entry Valid bit 142, page sizes 143, and logic modes 144, which will be described in more detail in FIG. 2. In this particular example, compare array 140 is configured as an array including 128 words or entries, of which each word or entry is 60 bits. Vertical search lines 145, namely 60 search lines, form an input of compare array 140. Horizontal match lines 147 form an output of compare array 140. Since compare array 140 stores 128 words or entries, compare array 140 includes the same number of match lines, namely 128. In actual practice, since the input of compare array 140 employs differential signalling, search lines 145 include 60 true and 60 complement search lines. The masked input search data is supplied to the compare array via these search lines 145.

FIG. 2 shows a table that provides examples of compare mask use in an extended memory to real address translation (ERAT) CAM including page sizes and logic modes support. In the Table of FIG. 2, detailed compare data is described per maskable bit. The first column, namely lookup type column 200, describes 1 through 19 lookup types and the top row describes four special bit segments of masked input search data or compare data. These 4 special bit segments include program address bit segment 201, entry valid bit segment 202, page sizes bit segment 203 and logic modes bit segment 204. Boxes marked with X's represent valid maskable bits within each combination on the table, and will be described in more detail below. The particular mask selected determines which particular lookup type is selected for a search of compare array 140. Program address 201, entry valid bit 202, pages sizes 203 and logic modes 204 of FIG. 2 correspond to program address 141, entry valid bit 142, page sizes 143 and logic modes 144 of FIG. 1.

Program address bit segment 201 is shown in smaller bit segments, the first bit segment being represented as 00:23 which corresponds to bits 0 through 23, namely the highest 24 bits of the program address. Program address segments, 24:29, 30:35, 36:39, 40:47 represent program address ranges between the highest order bits and the lowest order bits. Finally, bits 48:51 represent the lowest program address bits of the translated program address of 52 bits in this example. Moreover, in this example, the translated program address of 52 bits represents the highest order bits of the complete program address of 64 bits, where the lowest 12 bits are not input or, more specifically, not translated by CAM system 100. Rather, the lowest 12 are used without translation as index bits into the total memory address page size of 64 bits outside of CAM system 100 in this example.

A program address is the typical input search data applied to an address translation CAM employed for address translation. This program address is the word input used in a lookup for address translation matches. As seen in FIG. 2, the program address consumes most of the 60 bits of the total input data, but does not include the unique bits employed for specific control mode data and page size selection as described in more detail below.

Referring again to FIG. 2, after the program address bits 00:51, the next bit shown is Entry Valid bit 52 namely a single bit of input data that is also fed to compare array 140 of FIG. 1. Entry Valid is used to indicate a valid address for translation cycle purposes. As indicated in the boxes marked with X's in FIG. 2, Entry Valid is a valid maskable bit for lookup types numbered 10 through 13 and types 18 and 19. Lookup types will be described in more detail below.

Continuing with the compare input data of FIG. 2, the page sizes bit segment 203 includes page sizes bits 52, 53, and 54, which are selectable as 4 KB, 64 KB, and 16 MB, respectively, in this address segment. Page modes describe the page sizes in CAM memory provided as lookup data in compare array 140. During a single CAM operation or clock cycle only one page size is selected and tested or compared against. As the boxes marked in X's in FIG. 2 represent, address bits marked with X's are masked in relation to which page size is being currently compared. For example, a 4 KB page (lookup type 1) uses the entire program address, whereas a 64 KB translation (lookup type 2) masks the lower 4 bits of the program address, namely bits 48:51. Moreover, in a 16 MB address translation (lookup type 3) a mask would be used for the 8 additional program address bits 40:47, as well as bits 48:51

Finally, logic modes bit segment 204 includes the last 4 bits of the 60 bit input data, i.e. bits 56, 57, 58 and 59, which control respective logic modes, namely thread ID (TI), data relocate (DR), translation algorithm (TA), and hypervisor (HV). Each of these input data bits is individually maskable and provides for specific CAM system 100 functions as described below.

The logic modes represented in logic modes bit segment 204 are believed to represent a unique application of the maskable input function of CAM system 100 in a multi-thread or multi-program environment. Thread ID (TI) bit 56 is used as a switch between two independent threads or programs operating in conjunction with CAM system 100. With the selection of the thread ID (TI) bit via the mask, CAM system 100 generates specific address translation for that unique thread identified. Although unique threads, or executing programs, can use a specific CAM translation cycle, this mode does not preclude sharing output translation data when each thread uses identical translation addresses.

The second logic mode bit of logic modes bit segment 204 is the data relocate (DR) bit 57. Data relocate or "relocate" is detected as a match to the data relocate (DR) bit 57, namely as a logic high or 1. Data relocate mode determines if the effective address described by the program address input to compare array 140 is converted to a real address through a translation algorithm. In addition, data relocate (DR) bit 57, when detected as a logic low or 0, defines "real mode" addresses. Real mode determines that the effective address described by the program address input to compare array 140 is used as the real address and not translated to a new address. In practice, relocation address translations occur more commonly than real mode translations, although this is operating system and workload dependent. CAM system 100 achieves effective address to real address translation in this manner.

The third logic mode of logic modes bit segment 204 is the translation algorithm (TA) bit 58 that is used by CAM system 100 to identify a specific operating system mode associated with the current address translation. Many different algorithms can be used to translate addresses from one form to another. For purposes of example, assume that CAM system 100 employs two different algorithms to translate addresses. One translation algorithm is specific to an operating system and the other translation algorithm is employed by both operating systems and programs. Alternatively, one translation algorithm may be associated with translations of a specific thread within an operating system and the other translation algorithm may be associated with a specific operating system and no specific thread of an instruction stream of a software application. In either case, translation algorithm (TA) bit 58 identifies which of two translation methods is employed by CAM system 100 to calculate the translated address.

Finally, the fourth logic mode of logic modes bit segment 204 is the hypervisor (HV) bit 59, the lowest order bit in this particular 60 bit word embodiment. Hypervisor is a special software function that resides outside of CAM system 100. It protects against conflicting uses of CAM system 100 by multiple threads or programs and restrains these threads from interfering with each other by means of address translation control such as restricting access to specific address locations. hypervisor (HV) mode can additionally be described as a watch dog over the entire system that protects the system memory from illegal address translations as determined by special hardware controls.

CAM system 100 may mask logic mode bits individually or in conjunction with other bits of logic modes bit segment 204 to provide multiple combinations of maskable address translation operations. An example of such masking is an entry deletion mode which provides for a combination of masking logic modes bit segment 204 and program address bits 201. When in entry deletion made, CAM system 100 invalidates or effectively deletes matched address entries instead of reading RAM in a normal real address translation operation. Entry deletion mode may be used to delete single, multiple, or entire CAM array data in a single CAM operation or clock cycle. Entry delete mode is described further in conjunction with the discussion below of lookup types 14 through 19 in FIG. 2. The logic modes possible are not limited to the particular modes described above. Multiple combinations and re-mapping of the above described logic modes, in conjunction with both page sizes and the program address ranges, can create many useful combinations.

In lookup type column 200, FIG. 2 shows 19 representative lookup types employed by CAM system 100. Each of the following 19 lookup types 200 can be selectively activated in CAM system 100 dependent upon which bits 00:59 in the input search data are masked by mask data from compare mask register 130 during a CAM cycle. Again, masked bits are represented in FIG. 2 by boxes with an X therein to the right of the selected lookup type and directly below the specific bit that is being masked by dynamic compare bitline generator 120. Unique operations of CAM system 100 are represented by, but not limited to, lookup types described in lookup type column 200 in the FIG. 2.

More specifically, FIG. 2 shows 1 through 19 representative lookup types including for example the lookup types listed in TABLE 1 below:

TABLE 1

| LOOKUP TYPE | DESCRIPTION |
| --- | --- |
| 1 4 KB Match Page Independent | Provides translation matching for the full 52-bit maskable address range, 00:51 program address 201 regardless of the page size employed to translate the address. |
| 2 64 KB Match Page Independent | Provides translation matching for the highest order 48 bits or bits 00:47 of program address 201 regardless of the page size employed to translate the address. |
| 3 16 MB Match Page Independent | Provides translation matching for the highest order 40 bits or bits 00:39 of program address regardless of the page size employed to translate the address. |
| 4 4 KB Only Pages Thread Specific | Provides translation matching for the full maskable 52-bit address range for addresses defined as 4 KB pages, but specific to one thread (instruction stream). |
| 5 64 KB Only Pages Thread Specific | Provides translation matching for the highest order 48 bits or bits 00:47 of program address 201 but specific to one thread. |
| 6 16 MB Only Pages Thread Specific | Provides translation matching for the highest order 40 bits or bits 00:39 of program address 201 specific to one thread. |
| 7 4 KB Only Pages Thread Independent | Provides translation matching for the full maskable 52-bit address range for addresses defined as 4 KB pages, namely for addresses defined in that range independent of any specific thread association. This lookup type is considered to be valid across all threads. |
| 8 64 KB Only Pages Thread Independent | Provides translation matching for the highest order 48 bits or bits 00:47 of program address 201 for addresses defined in that range independent of any specific thread. |

TABLE 1-continued

| LOOKUP TYPE | DESCRIPTION |
| --- | --- |
| 9 16 MB Only Pages Thread Independent | Provides translation matching for the highest order 40 bits or bits 00:39 of program address 201 for addresses defined in that range independent of any specific thread association. |
| 10 Real Mode Entries | Provides translation matching for only those entries whose address is not relocated, more specifically, not moved in CAM system 100 memory. |
| 11 Translation Algorithm (TA) entries | Provides translation matching for only those entries whose address was translated with a particular algorithm. |
| 12 Hypervisor (HV) entries | Provides translation matching for those entries whose address is exclusive to the hypervisor mode of logic modes 204 described above. |
| 13 Real Mode Hypervisor Entries | Another combination of logic mode and program address bit masking that creates an exclusive function of the hypervisor mode wherein a program address is treated as "real mode" and the address is not relocated. |
| 14 TLBIE (translation lookaside buffer invalidate entry) local 4 KB page | TLBIE is associated with entry deletion mode described above. The TLBIE lookup type defines entry deletions in CAM system 100 memory of 4 KB page size ranges within a single clock cycle of operation of CAM system 100 |
| 15 TLBIE (translation lookaside buffer invalidate entry) local 64 KB page | Another entry deletion mode example. TLBIE local 64 KB page lookup type provides for a memory deletion of 64 KB page sizes in CAM system 100. |
| 16 TLBIE (translation lookaside buffer invalidate entry) remote 4 KB page thread ID | Another entry deletion mode example. Provides deleting memory within CAM system 100 associated with operating system programs outside of CAM page system 100 or, more specifically, deleting page size ranges of 4 KB independent of thread ID. |
| 17 TLBIE (translation lookaside buffer invalidate entry) remote 64 KB page | Another entry deletion mode example. Provides deleting memory ranges within CAM system 100 associated with 64 KB memory sizes for independent thread ID masks. |
| 18 SLBIE (segment lookaside buffer invalidate entry) | Another example of entry deletion mode. Provides deletion of segments of CAM system 100 memory sized as 36 bits of address. The segments thus deleted are associated with a specific thread ID. |
| 19 SLBIA (segment lookaside buffer invalidate all) specific thread | Another example of entry deletion mode. Provides deletion or invalidation of all memory segments associated with a memory size address of 36 bits. The segments thus deleted are associated with a specific thread ID. |

In summary of FIG. 2, the bits of input data that are masked to select or trigger a specific one of lookup types 1 through 19 are indicated by an X in the corresponding box to the right of the selected lookup type and aligned with the input compare data bits 00 thru 59 described above. Each specific lookup type represented corresponds to a unique set of maskable bits as shown again in FIG. 2. Additional examples and alternative masking combinations of program address 201, entry valid bit 202, page sizes 203, and logic modes 204 of FIG. 2 are possible and are not limited to the representative lookup type 200 examples shown in FIG. 2.

Returning to FIG. 1, compare array 140 is coupled to a data array 150 via match lines 147. Thus, the result of the search initiated by masked input search data at the input of compare array 140 is supplied to data array 150. For example, assume that compare array 140 is performing address translation. An address to be translated is supplied as input search data to compare register 110. Mask data is provided to compare mask register 130. The compare mask data is selected according to the table of FIG. 2 to achieve whatever masking and lookup type is desired for this particular application. Compare array 140 performs a search for a match to the masked input search data provide thereto. When performing the search, compare array 140 applies the lookup type 200 specified by the mask data. Compare array 140 performs the specified search and sends the result to data array 150 as an address where the translated address can be accessed. Data array 150 accesses the specified address and supplies that address to data register 160. In some applications, data array 150 can be segmented into a Machine Address 152 or lookup address, and Mode/Control bits 154. The Mode/Control bits 154 are used to reflect any additional detailed stored data associated with the translated address. An example of Mode/Control bits 154 may be a resultant local or remote data bit associated with and describing the translated address. Data array 150 operates as a lookup table of results for the previous masked compare search performed by compare array 140. The result that is looked up in data array 150 is then supplied by data array 150 to data output register 160 as the final resultant output data. In this manner, the disclosed CAM system 100 provides substantial control over the operating characteristics of a CAM such as the selection of page sizes and logic modes.

Figure 3:
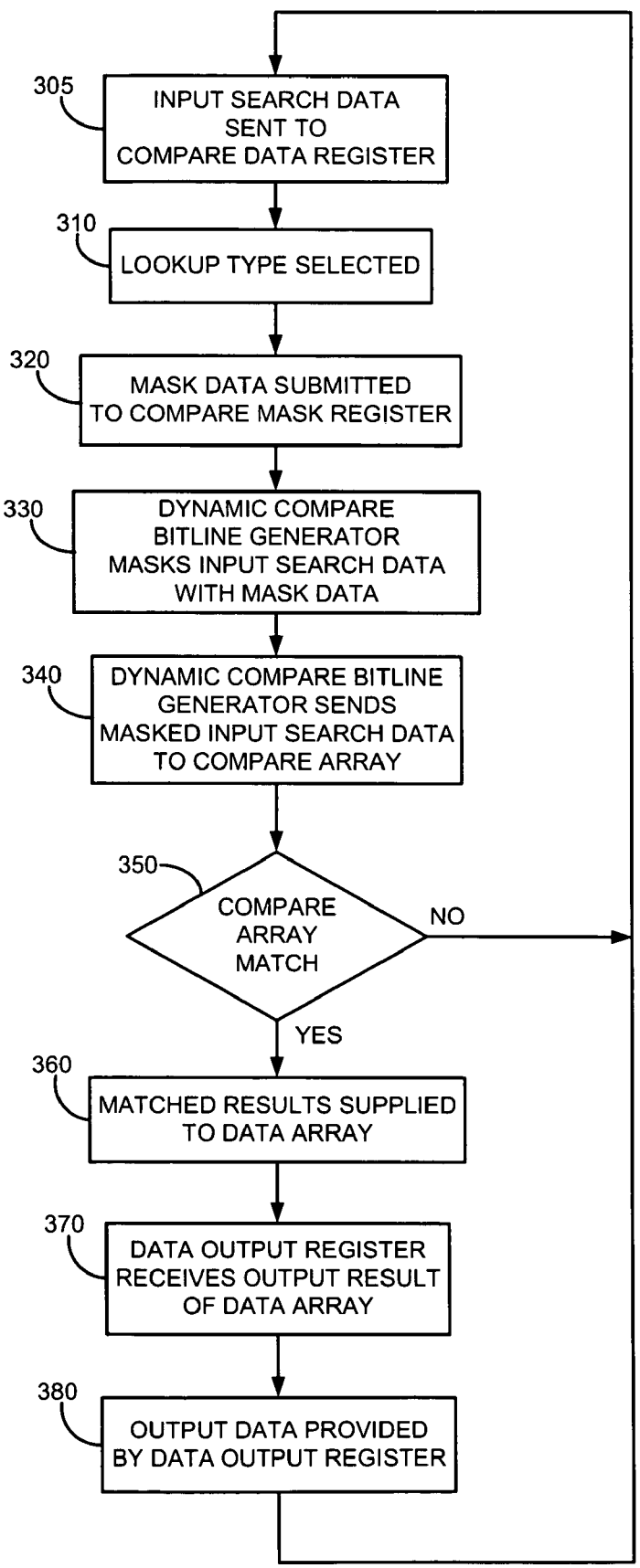
FIG. 3 is a flow chart that depicts process flow in the disclosed CAM system.

FIG. 3 is a flow chart depicting process flow when CAM system 100 implements the disclosed methodology. Input search data is supplied to compare data register 110 of CAM system 100 as per block 305. Next, as per block 310, one of lookup types 1 through 19 is selected according to the corresponding 60 bit selection table as described above with reference to FIG. 2. The lookup type thus selected is sent as 60 bits of mask data to compare mask register 130, as per block 320.

Input search data stored in compare data register 110 is masked by mask data stored in compare mask register 130 by dynamic compare bitline generator 120 as per block 320. Dynamic compare bitline generator 120 creates a masked version of input search data, as per block 330. Dynamic compare bitline generator 120 sends the masked input search data to compare array 140 per flowchart block 340.

Masked input search data is segmented into four groups of information. The first of these is program address 141 which includes 52 bits of the total 60 bits word length. The second of these groups is entry valid bit 142. The third of these groups is page size 143 which include 3 bits. And finally, the fourth of these groups is logic mode 144 which includes the lowest 4 bits of the total of 60 bits masked input search data as detailed in FIG. 1.

Compare array 140 executes a search for matching results to the masked input search data. As per decision block 350, if a compare does not result in a match, as indicated by a NO, process flow continues back to block 305 and the process begins again. However, if a compare results in a compare array match as indicated by a YES in block 350, then the matched results are supplied to data array 150 as per block 360.

Data array 150 receives the matched result, generates a memory lookup and outputs the result, which may include a machine address 152 and mode/control bits 154 segments, to data output register 160 as per block 370.

Finally, data output register 160 sends the output data to whatever external system requested the search as per block 380. Then process flow continues back to block 305 and a new search begins.

A content addressable memory (CAM) system is thus provided which provides not only a bit masking feature, but also the ability to control characteristics of a compare operation, such as page size and logic mode, via a compare mask.

Modifications and alternative embodiments of this invention will be apparent to those skilled in the art in view of this description of the invention. Accordingly, this description teaches those skilled in the art the manner of carrying out the invention and is intended to be construed as illustrative only. The forms of the invention shown and described constitute the present embodiments. Persons skilled in the art may make various changes in the shape, size and arrangement of parts. For example, persons skilled in the art may substitute equivalent elements for the elements illustrated and described here. Moreover, persons skilled in the art after having the benefit of this description of the invention may use certain features of the invention independently of the use of other features, without departing from the scope of the invention.

What is claimed is:

1. A method of operating a content addressable memory (CAM) comprising:
   providing a CAM that supports a plurality of selectable features;
   applying mask data to input search data to form masked input search data, the mask data indicating at least one of the selectable features selected;
   supplying the masked input search data to a compare array in the CAM to specify a search in the compare array and to specify the at least one selectable feature to be applied during the search; and
   providing a result of the search to an output.

2. The method of claim 1 wherein the plurality of selectable features includes page size of the CAM.

3. The method of claim 1 wherein the plurality of selectable features includes logic modes of the CAM.

4. The method of claim 1 wherein the plurality of selectable features includes lookup types.

5. The method of claim 1 wherein the input search data exhibits a first word length and the mask data exhibits a second word length.

6. The method of claim 1 wherein the first word length and the second word length are equal.

7. The method of claim 4 wherein the lookup types include page independent lookups.

8. The method of claim 4 wherein the lookup types include thread specific lookups.

9. The method of claim 4 wherein the lookup types include thread independent lookups.

10. The method of claim 4 wherein the lookup types includes real mode lookups.

11. A content addressable memory (CAM) system comprising:
    a compare array that supports a plurality of selectable features;
    a dynamic compare bitline generator, coupled to the compare array, that combines mask data with input search data to form masked input search data, the mask data indicating at least one of the selectable features selected, the masked input search data being supplied to the compare array to specify a search in the compare array and to specify the at least one selectable feature to be applied during the search; and
    a data array, coupled to the compare array, that provides the result of the search in the compare array.

12. The CAM system of claim 11 wherein the compare array provides an address to the data array that points to the result of the search.

13. The CAM system of claim 11 wherein the plurality of selectable features includes page size of the CAM.

14. The CAM system of claim 11 wherein the plurality of selectable features includes logic modes of the CAM.

15. The CAM system of claim 11 wherein the plurality of selectable features includes lookup types.

16. The CAM system of claim 11 wherein the input search data and the mask data exhibits equal word lengths.

17. The CAM system of claim 15 wherein the lookup types include page independent lookups.

18. The CAM system of claim 15 wherein the lookup types include thread specific lookups.

19. The CAM system of claim 15 wherein the lookup types include thread independent lookups.

20. The CAM system of claim 15 wherein the lookup types includes real mode lookups.

* * * * *